(12) United States Patent
Kim et al.

(10) Patent No.: US 6,771,088 B2
(45) Date of Patent: Aug. 3, 2004

(54) METHOD AND APPARATUS FOR TESTING SEMICONDUCTOR DEVICES USING THE BACK SIDE OF A CIRCUIT BOARD

(75) Inventors: Chang-Nyun Kim, Cheonan (KR); Sun-Ju Kim, Cheonan (KR); Jong-Hyun Kim, Suwon (KR); Chung-Koo Yoon, Seoul (KR); Sang-Jun Park, Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/752,998

(22) Filed: Dec. 28, 2000

(65) Prior Publication Data

US 2001/0033181 A1 Oct. 25, 2001

(30) Foreign Application Priority Data

Apr. 19, 2000 (KR) .................................. 10-2000-20654

(51) Int. Cl.[7] .......................... G01R 31/28; G01R 31/02
(52) U.S. Cl. ..................................... 324/765; 324/158.1
(58) Field of Search ............................. 324/765, 158.1, 324/73.1, 755; 361/807, 818

(56) References Cited

U.S. PATENT DOCUMENTS

| | | | |
|---|---|---|---|
| 3,711,626 A | * | 1/1973 | Kilby et al. ................ 361/807 |
| 4,890,199 A | * | 12/1989 | Bentler ........................ 361/818 |
| 5,557,508 A | * | 9/1996 | Sato et al. ................... 361/818 |
| 5,607,538 A | * | 3/1997 | Cooke ......................... 361/705 |

* cited by examiner

Primary Examiner—Ernest Karlsen
(74) Attorney, Agent, or Firm—Marger Johnson & McCollom, P.C.

(57) ABSTRACT

A test system for a semiconductor device couples the device to the back side of a circuit board, thereby allowing the device to be tested under actual operating conditions while providing adequate clearance around the device to accommodate automatic handling equipment, and also reducing signal delay and distortion. A system in accordance with the present invention includes a circuit board having circuitry adapted to provide an actual operating environment for the semiconductor device, as for example, a low cost mother board for testing memory devices. The device is coupled to the back side of the circuit board through test terminals formed on the back side of the board. An interface board can be used to correct the pin arrangements, which are reversed because they protrude from the back side of the board, and to compensate for the environmental differences caused by use of sockets and additional equipment on the interface board.

22 Claims, 5 Drawing Sheets

METHOD AND APPARATUS FOR TESTING SEMICONDUCTOR DEVICES USING THE BACK SIDE OF A CIRCUIT BOARD

This application claims priority from Korean patent application No. 2000-20654 filed Apr. 19, 2000 in the name of Samsung Electronics Co., Ltd., which is herein incorporated by reference.

BACKGROUND OF THE INVENTION

1. Field of the Invention

The present invention relates generally to testing semiconductor devices, and more particularly a method and apparatus for testing semiconductor devices using the back side of a circuit board.

2. Description of the Related Art

After completion of the wafer-fabrication and packaging processes, semiconductor devices are tested for reliability. When testing memory devices such as SDRAM (Synchronous Dynamic Random Access Memory), Rambus DRAM or SRAM (Static Random Access Memory), the packaged device is inserted into a test socket which interfaces the device to test equipment that checks the electrical and functional characteristics as well as the reliability of the device.

Conventional test equipment, which is relatively expensive, raises the cost of the test process and consequently imposes a heavy cost burden on the end-consumer of the finished products. In addition, since conventional test equipment cannot duplicate the actual operating conditions for the device under test (DUT), the testing process has a low accuracy. Therefore, it is recognized that testing under actual conditions, where the assembled devices are actually used, is preferable to using test equipment.

In order to test memory devices under the actual operating conditions, a memory device is coupled to a mother board for a personal computer or a workstation, and tested by operating the personal computer or the workstation. Memory devices are usually coupled to mother boards by mounting several memory devices to a memory module and then plugging the memory module into a socket on the mother board.

FIG. 1 and FIG. 2 are top and side views, respectively, showing a conventional test apparatus 150 for semiconductor devices mounted on a memory module. The memory module 15 is inserted directly into a socket 153 mounted on a mother board 151. However, since peripheral components such as add-in boards 161a and 161b around the socket 153 obstruct the insertion and removal of the memory module 15, it is difficult to accurately test the memory module. The lack of space around the socket 153 also makes it impossible to automate the insertion and removal of the memory module.

FIG. 3 and FIG. 4 are top and side views, respectively, showing another conventional test apparatus 170 which prevents obstruction by peripheral components such as add-in boards 181a and 181b mounted on the mother board 171. In order to obtain sufficient space, the test apparatus 170 employs an extension board 174 inserted into a first socket 173 and a second socket 176. The test apparatus 170 further comprises an interconnection board 175 to test the memory module 15. The interface board 175 is fixed to the motherboard 171 by fasteners 185. The test apparatus 170 is an improvement over the test apparatus 150 of FIG. 1. However, the structure increases the length of the contact points, and therefore, it is difficult to apply to high-speed products because it causes delay and/or distortion of the electrical signals. An additional problem with the test apparatus 170 is that it only provides week support for the test sockets 177.

SUMMARY OF THE INVENTION

One aspect of the present invention is a system for testing a semiconductor device comprising a circuit board comprising circuitry adapted to provide an actual operating environment for the semiconductor device, the circuit board having a front side and a back side; and test terminals formed on the back side of the circuit board and arranged to couple the semiconductor device to the circuit board.

Another aspect of the present invention is a method for testing a semiconductor device comprising coupling the semiconductor device to the back side of a circuit board comprising circuitry adapted to provide an actual operating environment for the semiconductor device; and operating the circuitry on the circuit board.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which.

DETAILED DESCRIPTION

Figure 1:
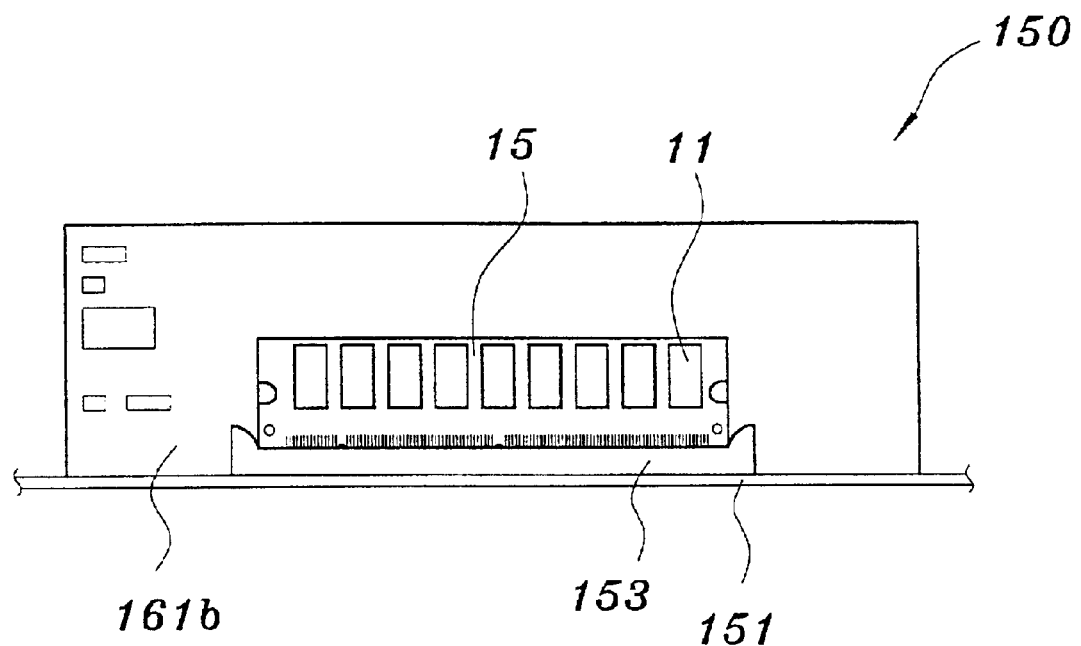
FIG. 1 is a top view showing a conventional test apparatus for memory modules.
Figure 2:
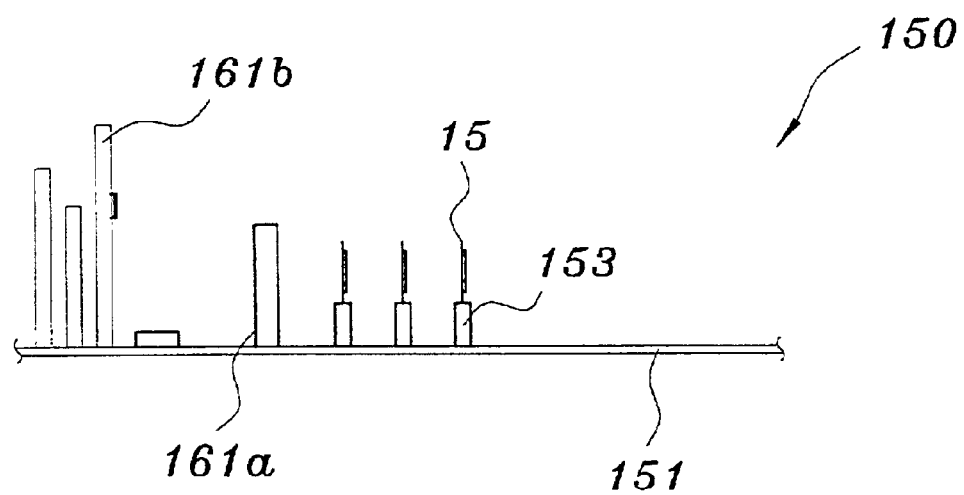
FIG. 2 is a side view of the test apparatus of FIG. 1.
Figure 3:
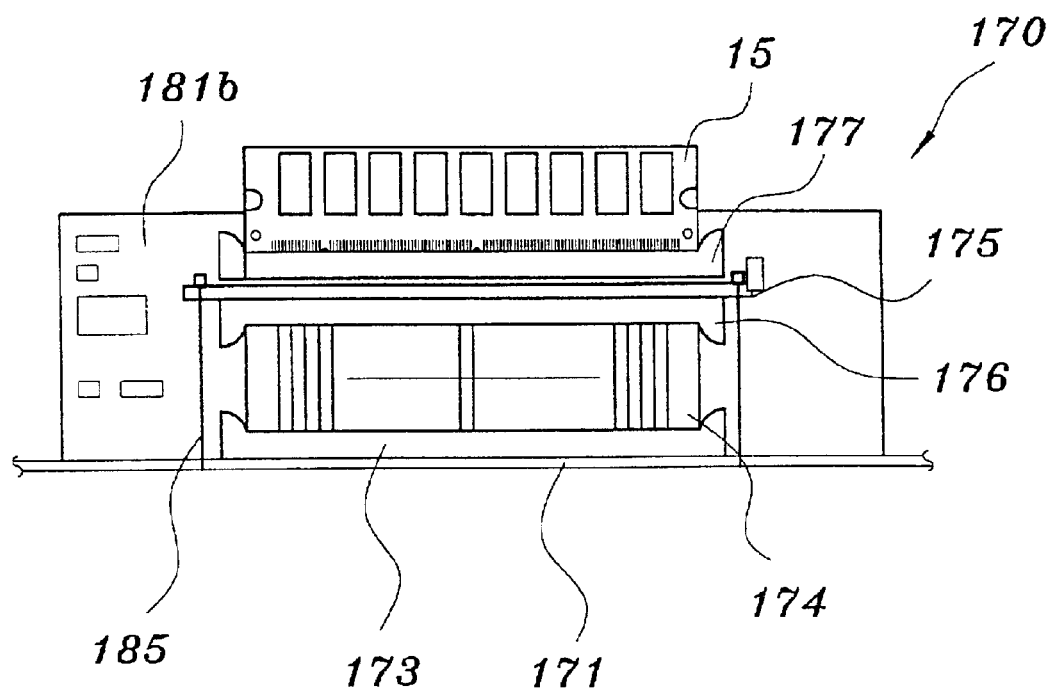
FIG. 3 is a top view showing another conventional test apparatus for memory modules.
Figure 4:
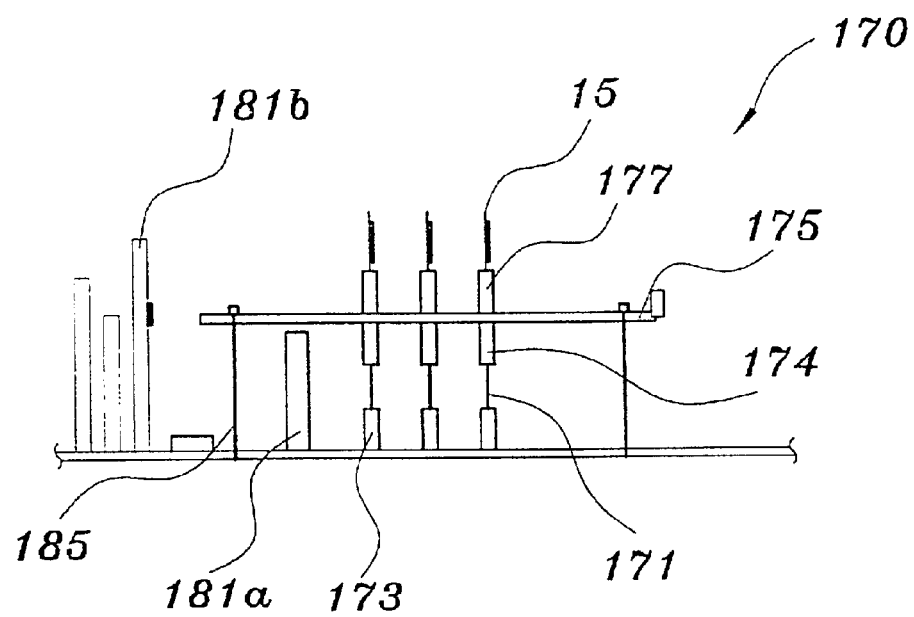
FIG. 4 is a side view of the test apparatus of FIG. 3.
Figure 5:
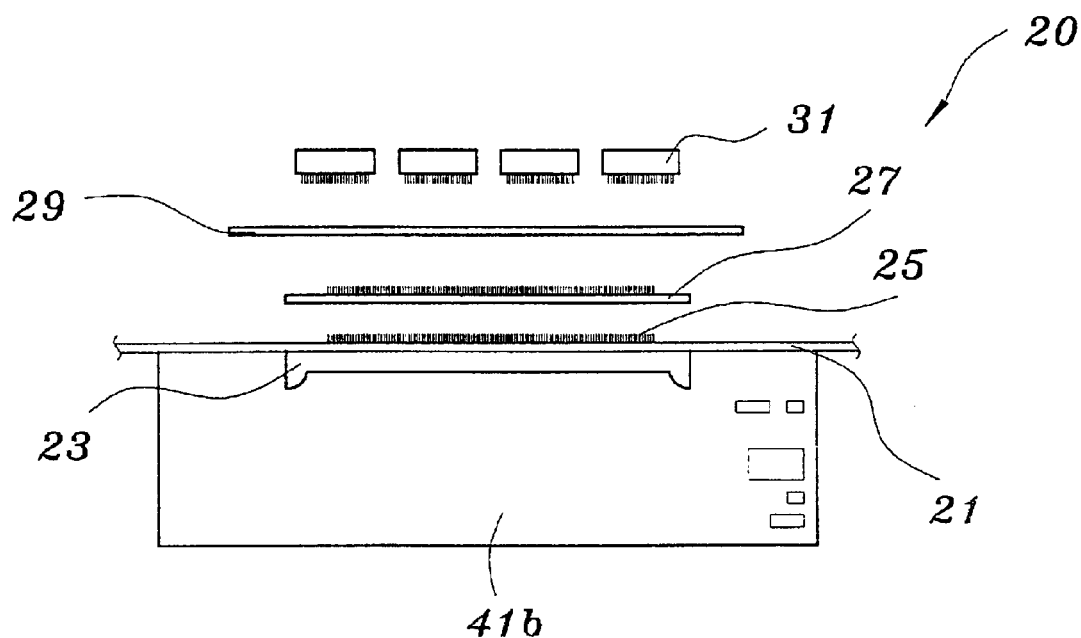
FIG. 5 is a top view showing an embodiment of a test system in an exploded state for semiconductor devices in accordance with the present invention.
Figure 6:
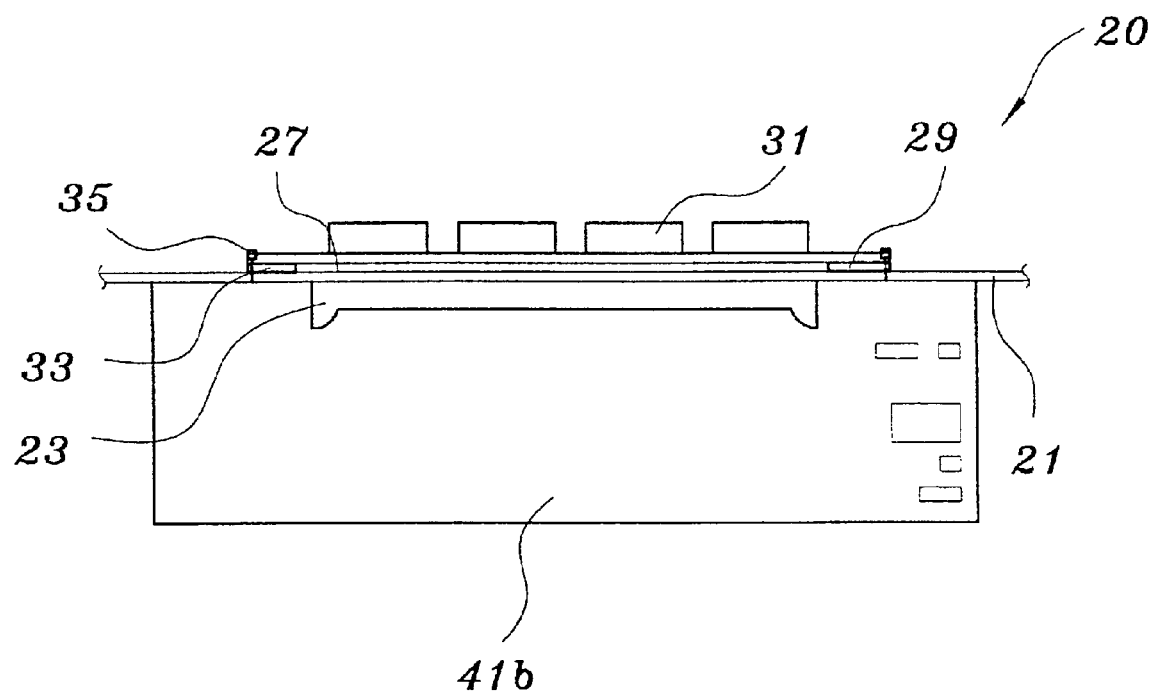
FIG. 6 is a top view showing the test system of FIG. 5 in an associated state.
Figure 7:
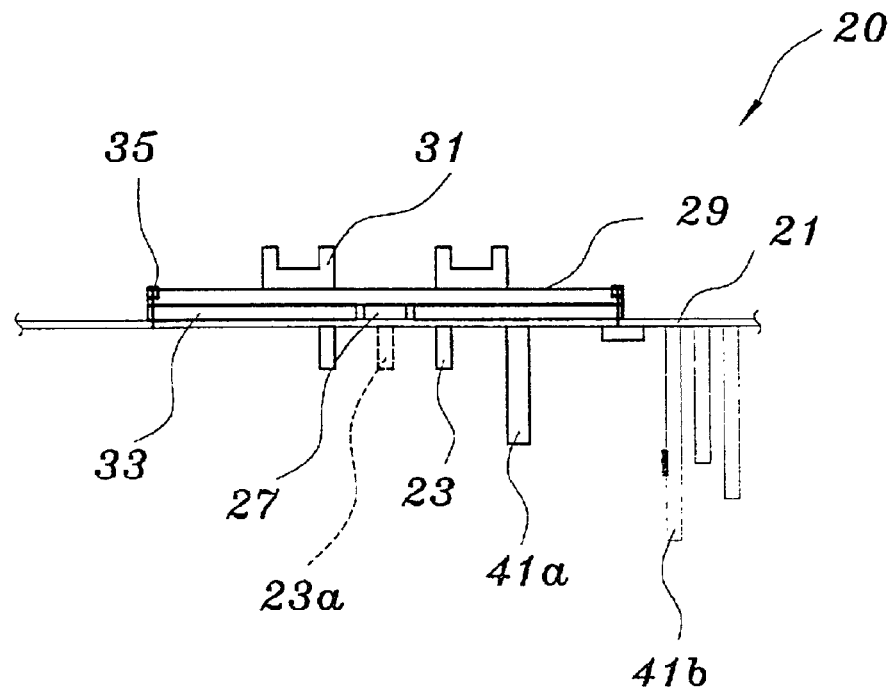
FIG. 7 is a side view of the test system of FIG. 6.

FIGS. 5, 6 and 7 are an exploded view, an associated top view, and a side view, respectively, of an embodiment of a test system 20 for semiconductor devices in accordance with the present invention. Test system 20 includes a circuit board 21 on which is fabricated circuitry that provides an actual operating environment for the semiconductor device being tested. In a preferred embodiment, the circuit board is an actual board-type product that utilizes the semiconductor device being tested for the purpose for which the device is intended. For example, if the semiconductor device to be tested is a memory device, the circuit board 21 is preferably a computer mother board, a communication appliance, or switching equipment. The present invention is not limited to this specific example, however.

Most circuit boards have a front or component side, on which all or most of the components are mounted, and a rear or back side, which typically has few, if any, components. The test system 20 shown in FIGS. 5–7 includes test terminals formed on the back side of the circuit board and arranged to couple the device to be tested to the circuit board. In the example of FIG. 5, the test terminals are connector pins 25 which are soldered to the back side of the circuit board. The test system 20 includes sockets 23 which are normally arranged to couple memory modules to the front surface of the circuit board 21 (in this example, a mother board). Referring to FIG. 7, however, one of the sockets 23a is removed and the connector pins 25 are formed on the rear surface of the mother board 21 on regions corresponding to the removed socket 23a shown by the dotted line. Alternatively, the connector pins 25 can be formed on the rear surface on regions corresponding to all sockets 23 without removing any of the sockets.

A connector 27 is preferably attached and electrically connected to the connector pins 25. The connector 27 is connected to an interface board 29 using contact or soldering methods. In this embodiment, the connector 27 is connected to the interface board 28 using connector pins (not shown) which are the same as the connector pins 25. Test sockets 31 for semiconductor devices are mounted on the interface board 29 for coupling the semiconductor devices to the circuit board 21 through the connector pins 25.

Since the connector pins 25 protrude from the rear surface of the mother board 21, the arrangement of the connector pins 25 is in the reverse order from the front surface of the mother board 21. The interface board 29 can be designed to again reverse this reverse arrangement of the connector pins 25, thereby allowing the use of a standard socket to couple a semiconductor device to the interface board.

The interface board 29 can be used simply to reverse the arrangement of the connector pins, or it can be designed to serve other functions as well. For example, it can be used to create a test environment for the semiconductor devices (in this example, memory devices) within the sockets 31 which are actual operating conditions that the devices might encounter on the circuit board. That is, the interface board 29 can be designed to compensate for the environmental differences caused by use of the sockets 31, as well as the use of additional equipment that might be added. An example of such an interface board is disclosed in Korean Patent Application No. 2000-20653 entitled "Interface Board And Test Method For Semiconductor Integrated Circuit Devices Using The Same." which is incorporated by reference, and U.S. patent application Ser. No. 09/733,336 filed Dec. 08, 2000 entitled "Method And Apparatus For Testing Semiconductor Devices Using An Actual Board-Type Product" which is incorporated by reference. For example, this compensation can include the control of the clock signal timing, the control of the signal timing margin, the control of AC signal parameters, and the control of the power supply signals.

The interface board 29 is supported between the interface board 29 and the mother board 21 by supports 33, and fixed to the mother board 21 by fasteners 35, thereby attaching the interface board 29 firmly to the mother board 21.

To test a semiconductor device using the system 20 of FIGS. 5–7, the device is inserted into a socket 31, the interface board 29 is attached to the back side of the mother board 21 through connector pins 25, and the circuitry on circuit board 21 is then operated. In the case of a mother board, there is usually a power-on self test that automatically tests the memory devices.

Figure 8:
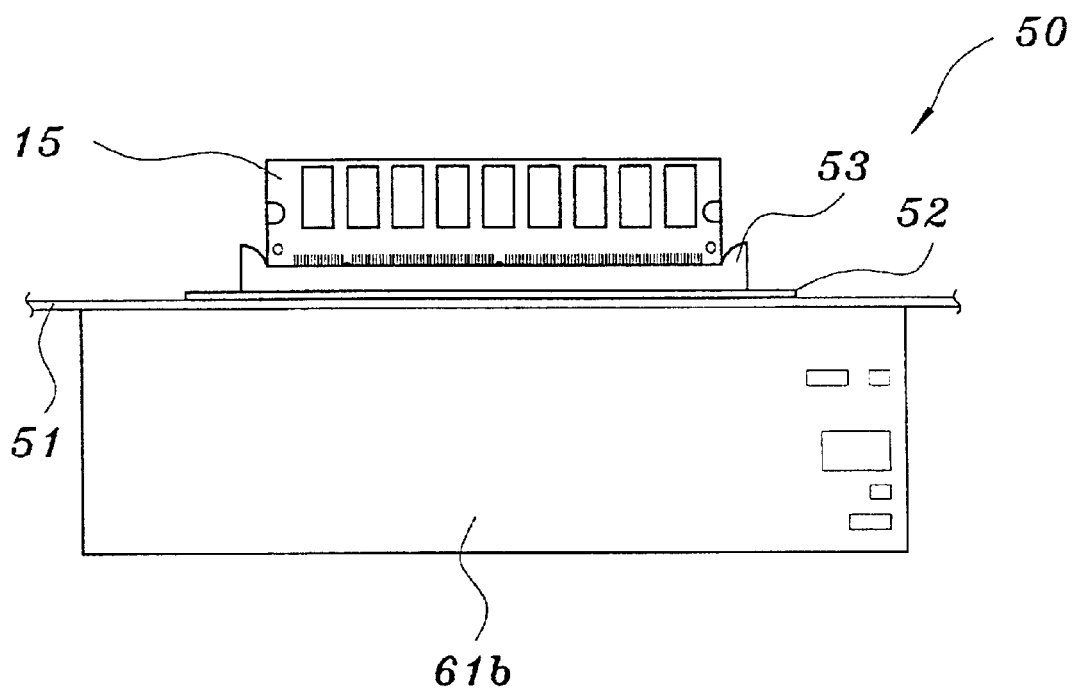
FIG. 8 is a top view showing another embodiment of a test system for semiconductor devices in accordance with the present invention.
Figure 9:
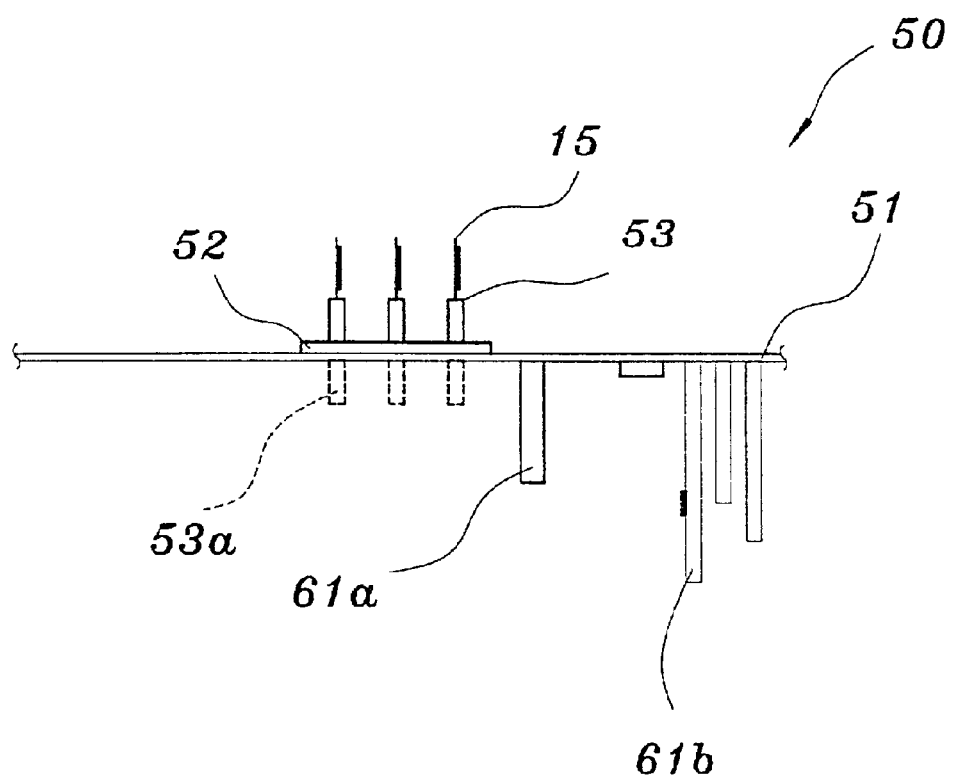
FIG. 9 is a side view of the test system of FIG. 8.

FIGS. 8 and 9 are top and side views, respectively, showing another embodiment of a test system 50 for semiconductor devices in accordance with the present invention. Test system 50 includes a circuit board comprising a mother board 51 and connector pins (not shown), the same as the test system 20 in FIG. 5. As shown in FIG. 9, sockets 53a for memory modules are removed and connector pins are formed on the rear surface of the mother board 51 on regions corresponding to the removed sockets 53a. In this embodiment, an interface board 52 is also used to again reverse the arrangement of the connector pins on the rear surface in the reverse order, and thereby allow sockets 53 to be used to test memory modules 15 by mounting them on the back side of the circuit board and then operating the circuitry on the circuit board.

As described above, a test system for semiconductor devices according to the present invention tests devices by coupling them to the back side of a circuit board, thereby eliminating interference with CPUs (not shown) or other peripheral components such as the add-in boards 41a, 41b in FIG. 7 or 61a, 61b in FIG. 9. Therefore, the present invention does not require the use of conventional connection boards or extension boards. The present invention also facilitates the use of automatic handling of the semiconductor devices that are to be tested. Accordingly, the present invention reduces the cost of testing semiconductor devices under actual usage conditions. It also eliminates the delay and/or distortion of the electrical signals caused by unnecessary resistance, inductance, and/or parasitical capacitance. Moreover, because the present invention allows the devices to be tested to be coupled to the back side of the circuit board, this provides extra clearance that allows the devices and/or the interface board to be oriented in positions that might otherwise be impossible if they were mounted on the component side.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A system for testing a semiconductor device comprising:
   a circuit board comprising circuitry adapted to provide an actual operating environment for the semiconductor device, the circuit board having a first side and a second side;
   test terminals formed on the second side of the circuit board and arranged to couple the semiconductor device to the circuit board; and
   an interface board coupled to the test terminals, wherein the interface board is adapted to reverse the arrangement of the test terminals.

2. The system of claim 1, wherein the test terminals are pins protruding from the second side of the circuit board.

3. The system of claim 1, wherein the test terminals are arranged to correspond to the terminals of a component on the first side of the board.

4. The system of claim 1, further comprising a connector coupled to the test terminals.

5. The system of claim 1, wherein the interface board is adapted to create a test environment that is the same as actual operating conditions for the semiconductor device.

6. The system of claim 1, further including a socket mounted on the interface board for coupling the semiconductor device to the circuit board.

7. The system of claim 6, wherein the socket is a socket for a module.

8. The system of claim 7, wherein the interface board is adapted to compensate for environmental differences caused the socket.

9. The system of claim 1, further comprising a support disposed between the interface board and the circuit board.

10. The system of claim 1, further comprising a fastener for attaching the interface board to the circuit board.

11. The system of claim 1, further comprising a connector coupled between the interface board and the test terminals.

12. The system of claim 1, further comprising a socket for a module coupled to the interface board.

13. The test system of claim 1, wherein the circuit board is a computer mother board, a communication appliance, or switching equipment.

14. The test system of claim 1, wherein the circuitry includes components, and wherein most of the components are formed on the first side.

15. The test system of claim 14, wherein some of the components are formed on the second side.

16. The test system of claim 14, wherein no components are formed on the second side.

17. A system for testing a semiconductor device comprising:
   a circuit board comprising circuitry adapted to provide an actual operating environment for the semiconductor device, the circuit board having a first side and a second side;
   means for coupling the semiconductor device to the second side of the circuit board,
   wherein the means for coupling the semiconductor device to the second side of the circuit board comprises test terminals formed on the second side of the circuit board and arranged to couple the semiconductor device to the circuit board, and
   wherein the means for coupling the semiconductor device is adapted to reverse the arrangement of the test terminals.

18. The system of claim 17, wherein the test terminals are pins protruding from the second side of the circuit board.

19. The system of claim 17, wherein the means for coupling the semiconductor device to the second side of the circuit board comprises a connector.

20. The system of claim 17, wherein the means for coupling the semiconductor device to the second side of the circuit board comprises an interface board coupled to the circuit board.

21. The system of claim 17, wherein the means for coupling the semiconductor device to the second side of the circuit board further comprises a socket mounted on the interface board for coupling the semiconductor device to the circuit board.

22. The system of claim 21, wherein the socket is a socket for a module.

\* \* \* \* \*

UNITED STATES PATENT AND TRADEMARK OFFICE
CERTIFICATE OF CORRECTION

PATENT NO. : 6,771,088 B2  Page 1 of 1
APPLICATION NO. : 09/752998
DATED : August 3, 2004
INVENTOR(S) : Kim et al.

It is certified that error appears in the above-identified patent and that said Letters Patent is hereby corrected as shown below:

At column 3, line 44, please replace "No. 09/733,336 filed" with -- No. 09/733,336, filed --

At column 3, line 45, please replace "entitled "Method"" with --entitled, now Pub. No. 2001-0034865, "Method--

Signed and Sealed this

Twenty-eighth Day of November, 2006

JON W. DUDAS
*Director of the United States Patent and Trademark Office*